United States Patent
Wells

(10) Patent No.: US 8,679,977 B2
(45) Date of Patent: Mar. 25, 2014

(54) METHOD AND APPARATUS PROVIDING MULTI-PLANED ARRAY MEMORY DEVICE

(75) Inventor: David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1351 days.

(21) Appl. No.: 11/828,092

(22) Filed: Jul. 25, 2007

(65) Prior Publication Data
US 2009/0027938 A1 Jan. 29, 2009

(51) Int. Cl.
*H01L 21/44* (2006.01)
*G11C 11/00* (2006.01)

(52) U.S. Cl.
USPC ........................................... 438/682; 365/163

(58) Field of Classification Search
USPC ...................... 438/84, 95, 102–103
See application file for complete search history.

(56) References Cited

U.S. PATENT DOCUMENTS

| | | | |
|---|---|---|---|
| 6,420,086 B1 | 7/2002 | Yang et al. | |
| 6,461,774 B1 | 10/2002 | Zimlich et al. | |
| 6,462,984 B1 | 10/2002 | Xu et al. | |
| 6,501,111 B1 | 12/2002 | Lowrey | |
| 6,537,728 B2 | 3/2003 | Michiels et al. | |
| 6,767,831 B1 * | 7/2004 | Chu et al. ........................ | 438/682 |
| 6,795,338 B2 * | 9/2004 | Parkinson et al. ............. | 365/163 |
| 2006/0120136 A1 | 6/2006 | Dennison et al. | |
| 2006/0203541 A1 * | 9/2006 | Toda .............................. | 365/163 |
| 2007/0029537 A1 | 2/2007 | Campbell | |
| 2007/0034905 A1 | 2/2007 | Elkins | |
| 2007/0045604 A1 | 3/2007 | Liu et al. | |

OTHER PUBLICATIONS

"A 90nm 1.8V 512Mb Diode-Switch PRAM with 266MB/s Read Throughput," ISSCC 2007 / Session 26 / Non-Volatile Memories / 26.1.

* cited by examiner

*Primary Examiner* — Fernando L Toledo
*Assistant Examiner* — Valerie N Newton
(74) *Attorney, Agent, or Firm* — Dickstein Shapiro LLP

(57) ABSTRACT

A three dimensional variable resistance memory array and method of forming the same. The memory array has memory cells in multiple planes in three dimensions. The planes of the memory cells include shared interconnect lines, dually connected to driving and sensing circuits, that are used for addressing the cells for programming and reading. The memory array is formed using only a single patterned mask per central array plane to form the memory cells of such planes.

24 Claims, 21 Drawing Sheets

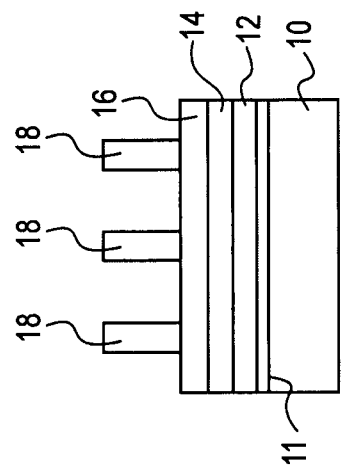
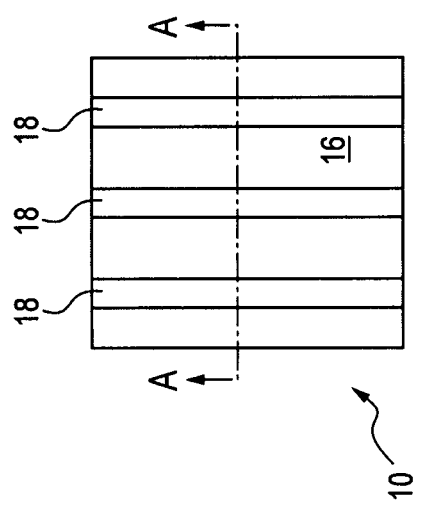
FIG. 3b
FIG. 3a

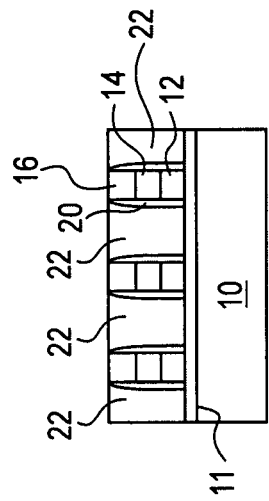
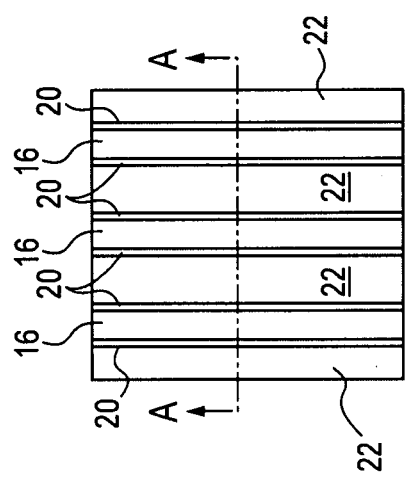
FIG. 5b
FIG. 5a

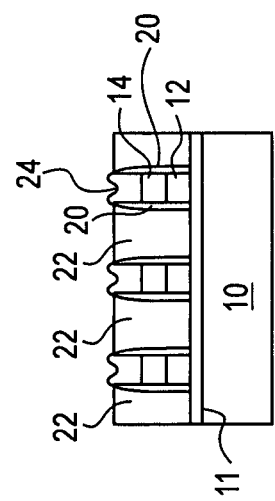
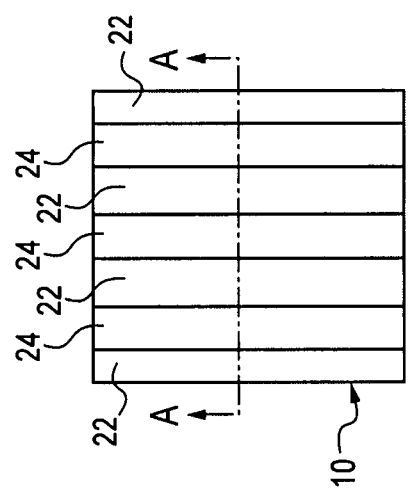

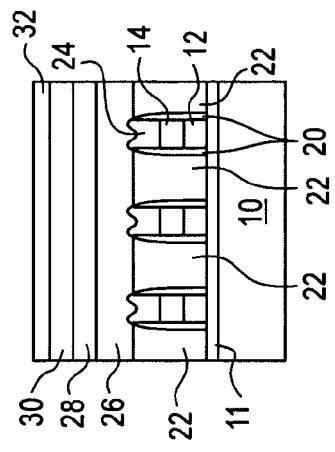
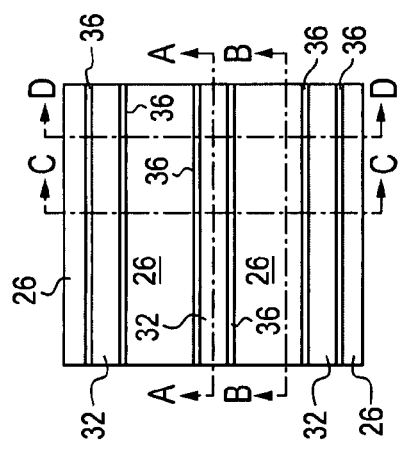
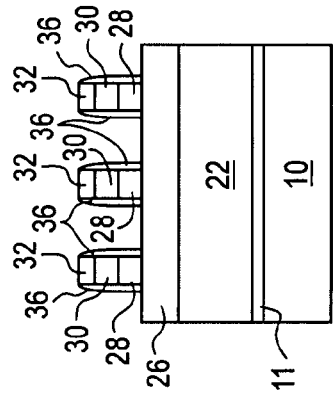
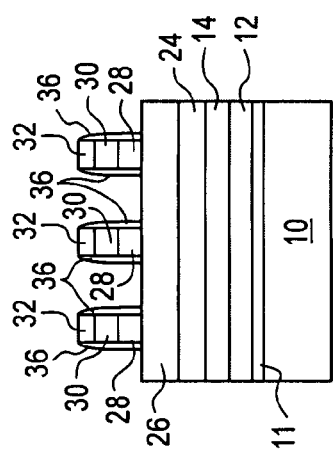
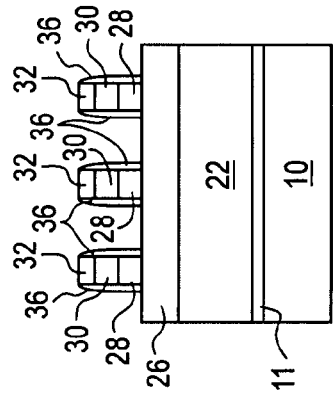

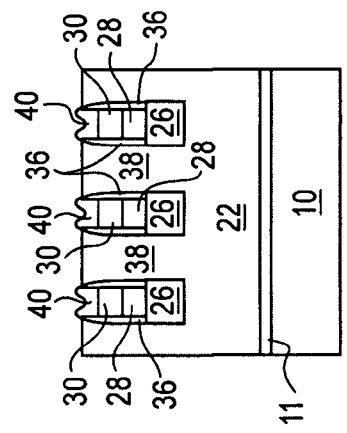
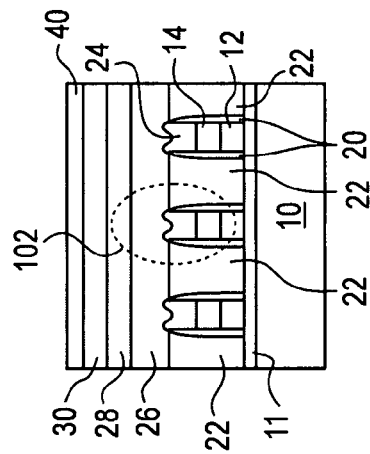
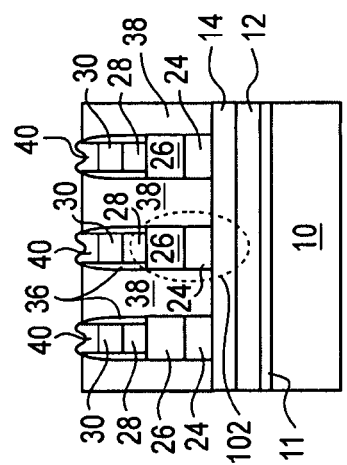
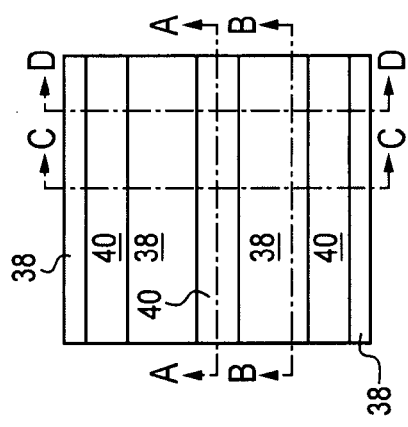
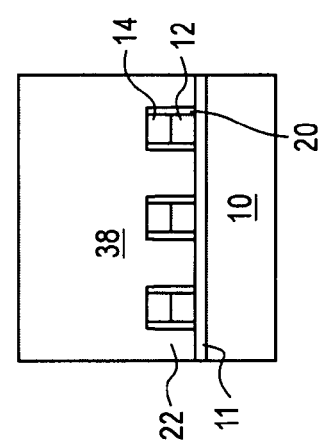
FIG. 11a
FIG. 11b
FIG. 11c
FIG. 11d
FIG. 11e

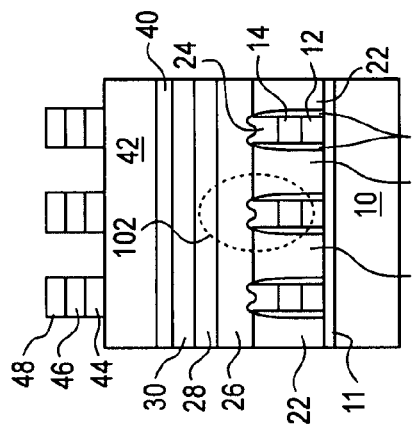
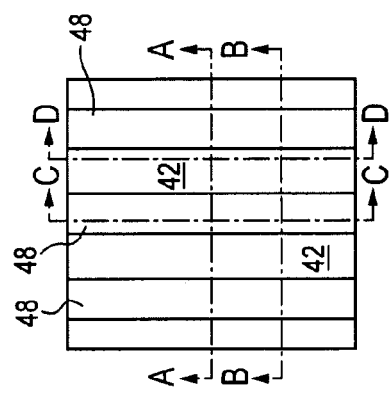
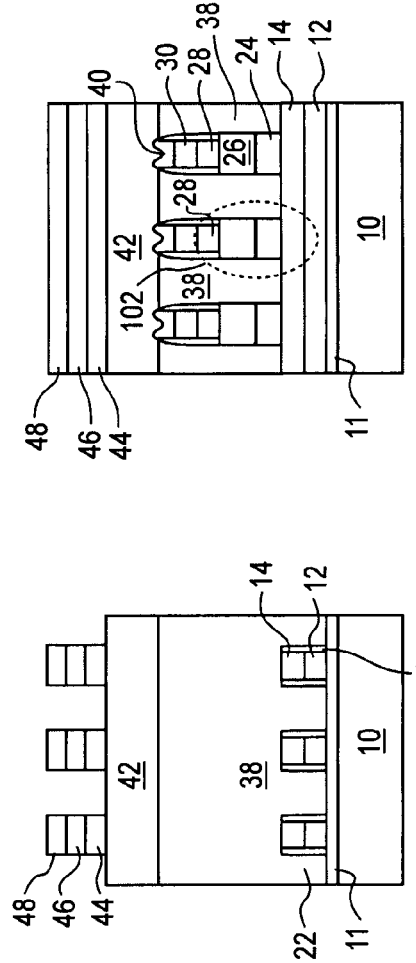
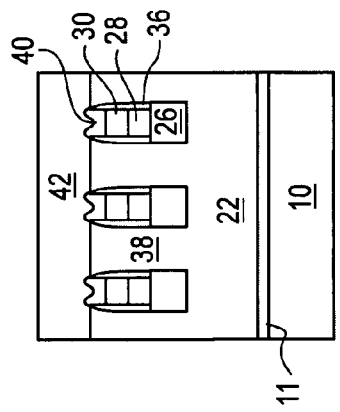
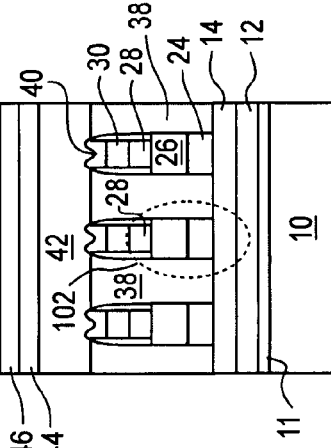

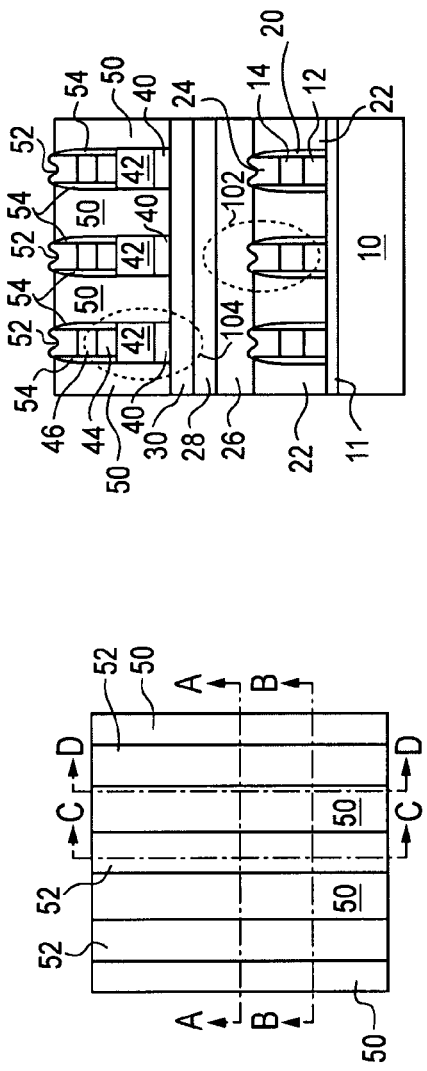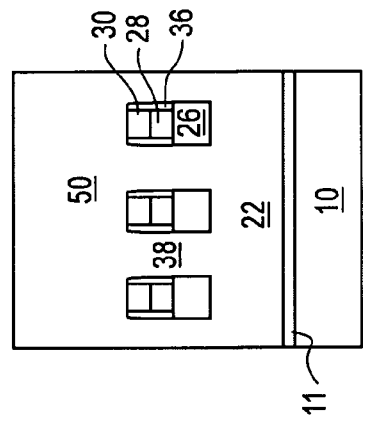
FIG. 14e
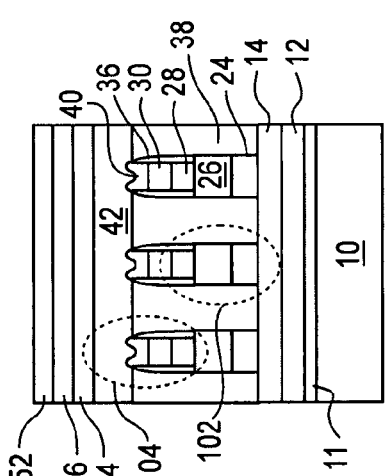
FIG. 14d
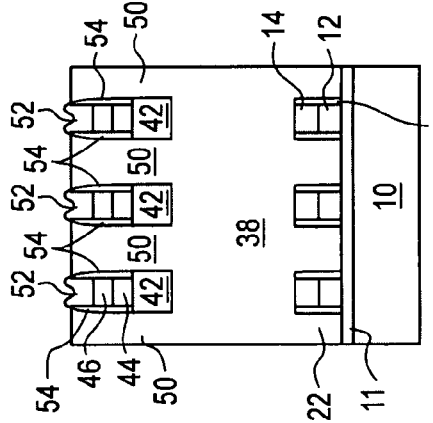

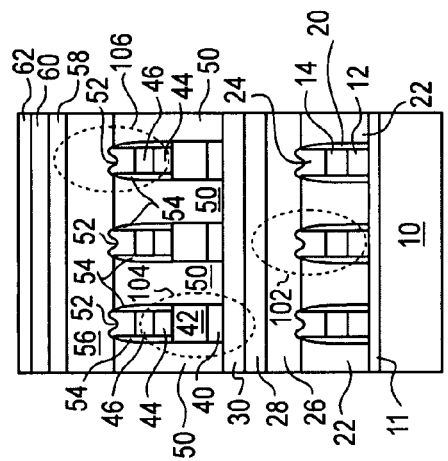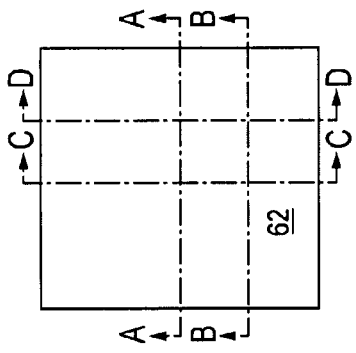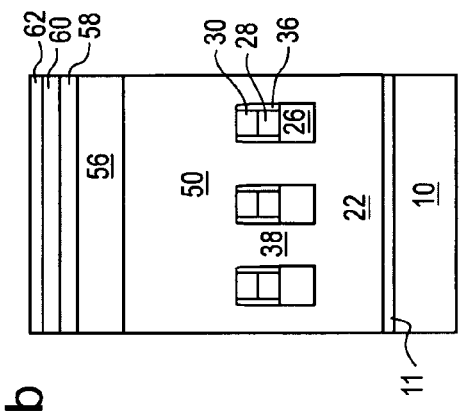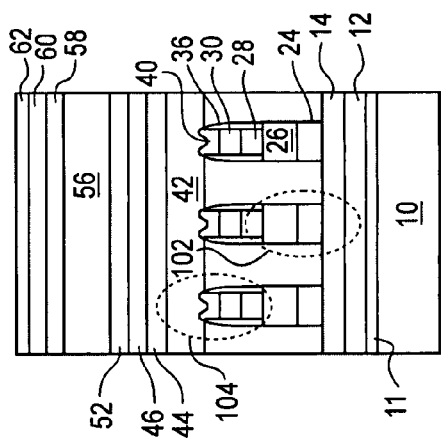
FIG. 15a  FIG. 15b  FIG. 15c  FIG. 15d  FIG. 15e

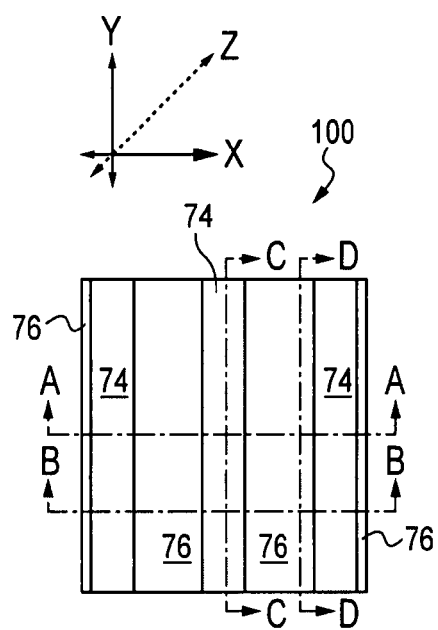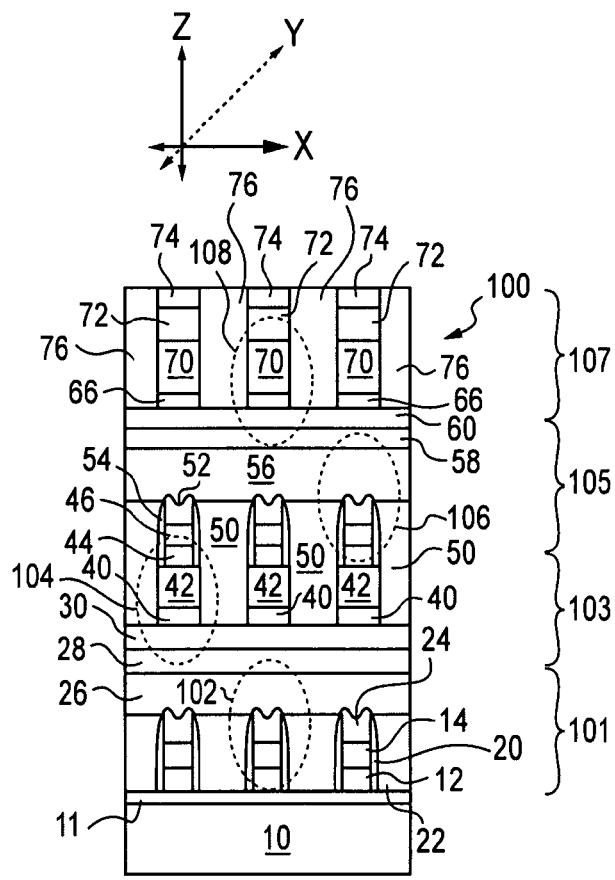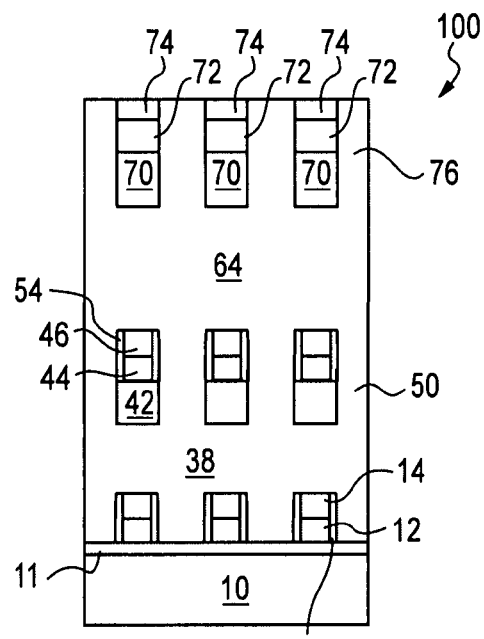
FIG. 17a
FIG. 17b
FIG. 17c

US 8,679,977 B2

METHOD AND APPARATUS PROVIDING MULTI-PLANED ARRAY MEMORY DEVICE

FIELD OF THE INVENTION

The present invention relates to semiconductor devices, and in particular resistance-variable memory devices, such as phase-change memory, and methods of forming the same.

BACKGROUND OF THE INVENTION

Non-volatile (or less-volatile) memories are important elements of integrated circuits due to their ability to maintain data absent a power supply. Phase change materials, among other resistance-variable memory types, have been investigated for use in non-volatile memory cells. Phase change memory cells include phase change materials, such as chalcogenide alloys, which are capable of stably transitioning between amorphous and crystalline phases. Each phase exhibits a particular resistance state and the resistance states distinguish the logic values of the memory cell. Specifically, an amorphous state exhibits a relatively high resistance, and a crystalline state exhibits a relatively low resistance. A phase change memory cell has a phase change material between first and second electrodes. As an example, the phase change material is a chalcogenide alloy, such as described in U.S. Patent Application Publication No. 2007/0029537 (application Ser. No. 11/194,623) and U.S. Patent Application Publication No. 2007/0034905 (application Ser. No. 11/199,257), each of which are incorporated by reference herein. Phase change memory elements can comprise Ge, Se, Sb, and/or Te (e.g., $Ge_2Sb_2Te_5$), or other chalcogenide-comprising alloys, with other optional materials positioned between two electrodes for supplying current to the element.

A portion of the phase change material is set to a particular resistance state according to the amount of current applied via the electrodes. To obtain an amorphous state, a relatively high write current pulse (a reset pulse) is applied to the phase change cell to essentially melt a portion of the material for a first period of time. The current is removed and the cell cools rapidly to a temperature below the glass transition temperature, which results in the portion of the material retaining an amorphous phase. To obtain a crystalline state, a lower current write pulse (a set pulse) is applied to the phase change cell for a second period of time (typically longer in duration than the first period of time) to heat the material to a temperature below its melting point. This causes the amorphous portion of the material to crystallize or re-crystallize to a crystalline phase that is maintained once the current is removed and the cell is rapidly cooled.

As in any memory type, it is a goal in the industry to have as dense a memory array as possible, so it is desirable to increase the number of memory cells in an array of a given chip area. In pursuing this, memory arrays have been designed in multiple planes in three dimensions, stacking planes of memory cells above one another. However, it is typical in the art to require many masks per memory array level for the formation of features of the memory cells and connecting circuitry. It is not uncommon for ten to twenty masks to be required per level during fabrication.

BRIEF DESCRIPTION OF THE DRAWINGS

FIG. 2a shows a portion of the memory array during a stage of fabrication subsequent to that shown in FIG. 1a.

FIG. 3a shows a portion of the memory array during a stage of fabrication subsequent to that shown in FIG. 2a; FIG. 3b shows a cross section of the array portion shown in FIG. 3a through line A-A.

FIG. 4a shows a portion of the memory array during a stage of fabrication subsequent to that shown in FIG. 3a.

FIG. 5a shows a portion of the memory array during a stage of fabrication subsequent to that shown in FIG. 4a; FIG. 5b shows a cross section of the array portion shown in FIG. 5a through line A-A.

FIG. 6a shows a portion of the memory array during a stage of fabrication subsequent to that shown in FIG. 5a; FIG. 6b shows a cross section of the array portion shown in FIG. 6a through line A-A.

FIG. 7a shows a portion of the memory array during a stage of fabrication subsequent to that shown in FIG. 6a.

FIG. 8a shows a portion of the memory array during a stage of fabrication subsequent to that shown in FIG. 7a.

FIG. 9a shows a portion of the memory array during a stage of fabrication subsequent to that shown in FIG. 8a.

FIG. 10a shows a portion of the memory array during a stage of fabrication subsequent to that shown in FIG. 9a; FIG. 10b shows a cross section of the array portion shown in FIG. 10a thorough line A-A; FIG. 10c shows a cross section of the array portion shown in FIG. 10a through like B-B; FIG. 10d shows a cross section of the array portion shown in FIG. 10a through line C-C; and FIG. 10e shows a cross section of the array portion shown in FIG. 10a through line D-D.

FIG. 11a shows a portion of the memory array during a stage of fabrication subsequent to that shown in FIG. 10a; FIG. 11b shows a cross section of the array portion shown in FIG. 11a through line A-A; FIG. 11c shows a cross section of the array portion shown in FIG. 11a through like B-B; FIG. 11d shows a cross section of the array portion shown in FIG. 11a through line C-C; and FIG. 11e shows a cross section of the array portion shown in FIG. 11a through line D-D.

FIG. 12a shows a portion of the memory array during a stage of fabrication subsequent to that shown in FIG. 11a.

FIG. 13a shows a portion of the memory array during a stage of fabrication subsequent to that shown in FIG. 12a; FIG. 13b shows a cross section of the array portion shown in FIG. 13a through line A-A; FIG. 13c shows a cross section of the array portion shown in FIG. 13a through like B-B; FIG. 13d shows a cross section of the array portion shown in FIG. 13a through line C-C; and FIG. 13e shows a cross section of the array portion shown in FIG. 13a through line D-D.

FIG. 14a shows a portion of the memory array during a stage of fabrication subsequent to that shown in FIG. 13a; FIG. 14b shows a cross section of the array portion shown in FIG. 14a through line A-A; FIG. 14c shows a cross section of the array portion shown in FIG. 14a through like B-B; FIG. 14d shows a cross section of the array portion shown in FIG. 14a through line C-C; and FIG. 14e shows a cross section of the array portion shown in FIG. 14a through line D-D.

FIG. 15a shows a portion of the memory array during a stage of fabrication subsequent to that shown in FIG. 14a; FIG. 15b shows a cross section of the array portion shown in FIG. 15a through line A-A; FIG. 15c shows a cross section of the array portion shown in FIG. 15a through like B-B; FIG. 15d shows a cross section of the array portion shown in FIG. 15a through line C-C; and FIG. 15e shows a cross section of the array portion shown in FIG. 15a through line D-D.

FIG. 16a shows a portion of the memory array during a stage of fabrication subsequent to that shown in FIG. 15a.

FIG. 17a shows a portion of the memory array during a stage of fabrication subsequent to that shown in FIG. 16a; FIG. 17b shows a cross section of the array portion shown in FIG. 17a through line A-A; FIG. 17c shows a cross section of the array portion shown in FIG. 17a through like B-B.

FIG. 18 shows a processor system incorporating a memory circuit comprising an array portion as shown in FIG. 17a.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over a base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art. Further, substrate can include circuitry, such as logic or access circuitry, and insulating layers so as to provide a platform upon which to form other integrated circuit devices.

Embodiments of the invention relate to resistance variable memory devices and methods of forming a three dimensional, i.e., stacked planes, array of such devices. Although the embodiments are described as being a phase change memory type, this is for illustrative purposes since the array architecture and methods of forming same apply broadly to other resistance variable memory types, such as, for example, programmable conductor memory, polymer memory, and others that can be used in a cross point architecture.

Figure 17D:
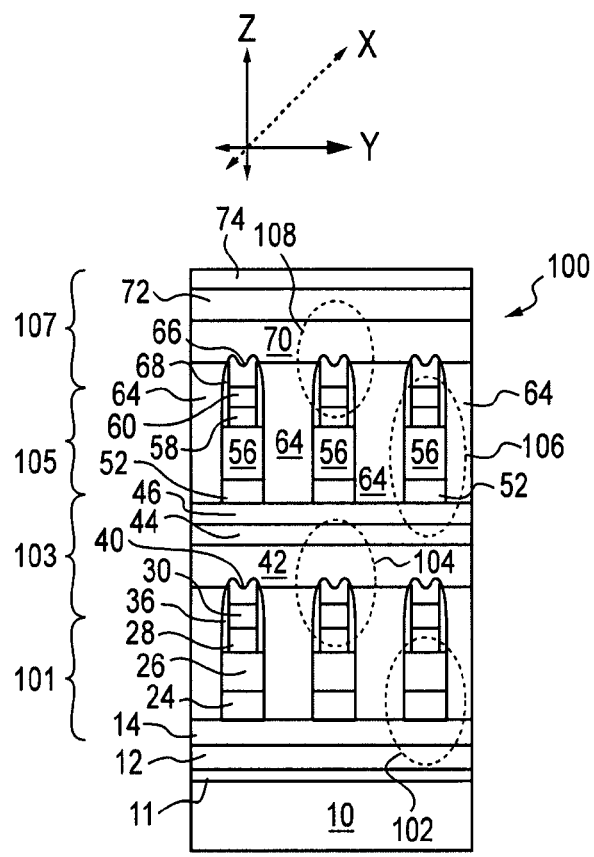
FIG. 17d shows a cross section of the array portion shown in FIG. 17a through line C-C.
Figure 17E:
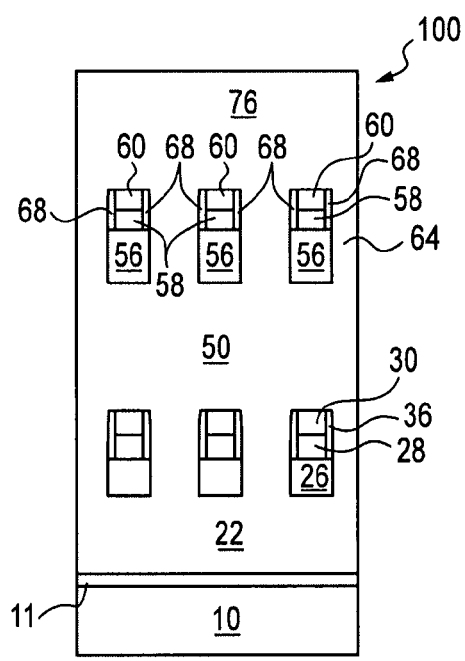
FIG. 17e shows a cross section of the array portion shown in FIG. 17a through line D-D.

The embodiments of the invention are now explained with reference to the figures, which illustrate exemplary embodiments and throughout which like reference numbers indicate like features. A portion of a phase change memory array in accordance with an embodiment of the invention is shown in FIG. 17a and FIGS. 17b, 17c, 17d, and 17e, which show various cross sections of the array portion shown in FIG. 17a. Cross sectional views shown in FIGS. 17b and 17d show the layout of planes 101, 103, 105, 107 of memory cells and cross sectional views shown in FIGS. 17c and 17e show the isolation of the memory cells by insulating material.

As shown in these figures, the array 100 has a stacked configuration of phase change memory cells 102, 104, 106, and 108 (see dashed rings identifying the cells), each arranged in a plane 101, 103, 105, 107 of many memory cells, each including an electrode line, e.g., 28, a phase change material, e.g., 26, a silicide diode material, e.g., 24, a poly diode material, e.g., 14, and another electrode, e.g., 12, for memory cell 102, which is exemplary of the other cells in the multiple planes 101, 103, 105, 107. At least the poly diode material, e.g., 14, and electrode line, e.g., 28, are within sidewall spacers, e.g., 20, that define the stack dimensions of the memory cell, e.g., 102. The diodes (e.g., materials 14 and 24) are access devices for the memory elements, e.g., phase change material 26. The access devices need not necessarily be diodes, but can be other two-terminal devices, such as rectifiers or threshold switching devices.

The memory cells 102, 104, 106, 108 are defined at the cross point intersections of electrode lines, e.g., 12 and 28, 28 and 44, 44 and 58, 58 and 72, and the stacked configuration of the memory cells 102, 104, 106, 108 is shown by the layering of the phase change material 26, 42, 56, 70. Electrode lines, e.g., 12, 28, 44, 58, 72, are arranged in a cross point architecture and interconnect memory cells positioned along the same lines. Four memory cell planes 101, 103, 105, 107 are shown in this way, with each such plane 101, 103, 105, 107 having a two dimensional array of multiple memory cells, e.g., in the X, Y plane. The X, Y, Z dimensions are shown in FIGS. 17a, 17b, and 17d. The planes 101, 103, 105, 107 of memory cells are sacked in the Z dimension so as to provide a three dimensional array where any single memory cell can be addressed for programming or reading by its X, Y, Z coordinates. Although four such planes 101, 103, 105, 107 are shown in the figures, it should be understood that fewer or greater planes of memory cells can be included in the array 100.

Each electrode line 28, 44, and 58 that is not the array's 100 top-most, e.g., 72, or bottom-most electrode line, e.g., 12, can serve as both a bit line and as a wordline in addressing memory cells for programming and reading. As shown in FIG. 17b, for example, the electrode line 28 is configured so that it serves as a bit line for memory cell 102 and as a wordline for memory cell 104 as each respective memory cell 102, 104 is addressed for reading or writing. Although the terms bit line and wordline originated in relation to DRAM technology to indicate the line carrying stored information signal and the line carrying an access control signal, respectively, herein they are used to indicate two cross point arranged, intersecting, interconnect lines for addressing a memory cell in a memory array and just as well could be called row lines and column lines or simply, interconnect lines.

The structure of the array 100 allows the central array planes, i.e., not necessarily the top-most or bottom-most, such as the planes 103 and 105 incorporating memory cells 104 and 106, respectively, to be fabricated with a single mask per plane and, potentially, a single mask pattern for all such planes, which makes processing faster, simpler, and less expensive when compared to techniques requiring multiple masks for memory array layer fabrication. Because the memory cells, e.g., 104, are composed of stacks of layers defined by the dimensions of a hard mask (FIGS. 2b to 16e) 16, 32, 48, 62, and sidewall spacers 36, 54, 68, the photolithographic mask (e.g., FIG. 8d, 34) that defines the hard mask, e.g., 32, dimension (when etched) is the only mask needed during the fabrication of the respective memory cell plane. The formation of the sidewall spacers during processing, which does not require another mask, completes the definition of the memory cell dimensions and, so, only a single mask is needed.

This cross-point arrangement of the array 100 structure allows for a self-aligned process in forming the memory elements. A self-aligned memory element enables higher density memory arrays in a production environment than would be feasible with memory elements which must have other layers aligned, such as contacts. Masking techniques such as pitch multiplication, as described in U.S. patent application Ser. Nos. 11/214,544 and 11/514,117, and U.S. Pat. No. 5,328,810, incorporated herein by reference, may be utilized in accordance with the invention.

A self-aligned cross-point structure created with an orthogonal line/space pattern allows high density lines without the tight alignment/registration normally required for memory element fabrication. Typically, the maximum allowed registration error is ⅓ f (where f is the minimum feature line/space dimension), but with a self-aligned cross-point technology, the only alignment requirement is in connecting the ends of the lines to drivers and sense devices. While this involves some overhead of area at the edges of the array 100, it allows one to approach a 4 f footprint per memory element at very small dimensions for f, e.g., about 18-50 nm. Stacking such memory elements in the way described herein makes the memory array density even higher and approaches a 1 f footprint/memory element for a 4-tier stack of such memory elements as shown in FIGS. 17b-17e. Thus, higher density product is enabled by a stacked self-aligned cross point memory element structure as described and claimed herein.

Figure 20:
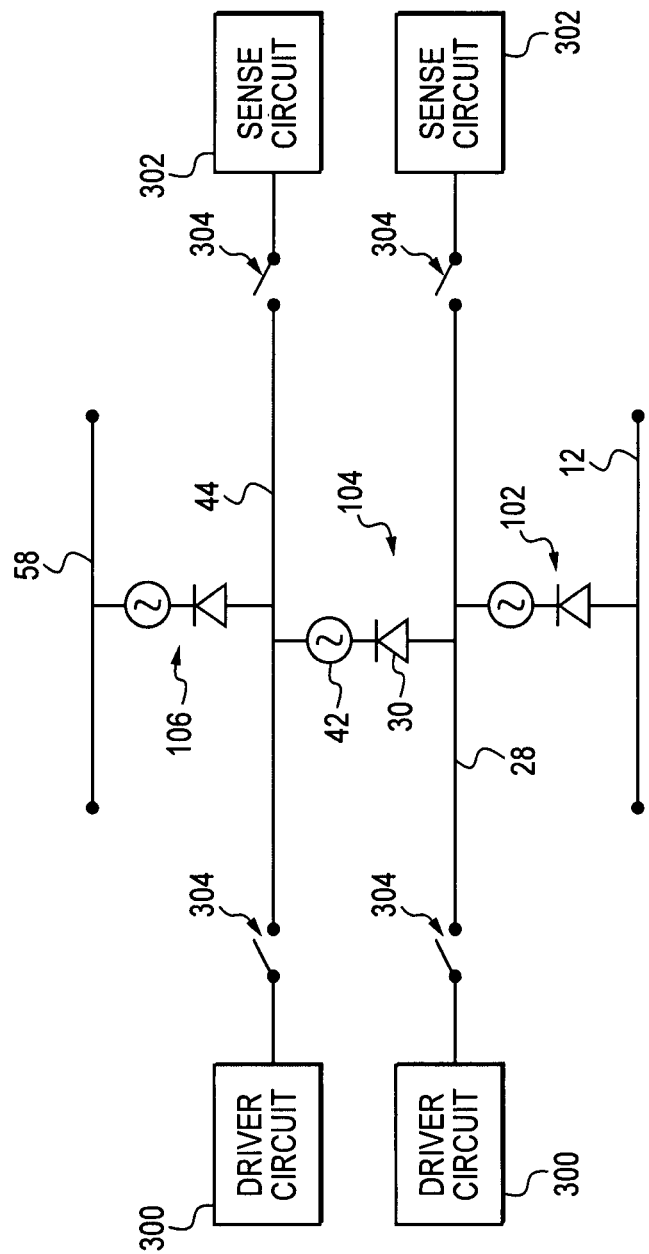
FIG. 20 shows a simplified circuit diagram for shared interconnect lines of a memory array.

FIG. 20a shows how this array 100 configuration includes a driver 300 and sense 302 circuit connected to each of the central electrode lines 28, 44, and 58 such that the driver circuit 300 of a respective electrode line, e.g., 28, is used with the memory cell 104 of one plane of memory cells, and the sense circuit of that respective line, e.g. 28, is used with the memory cell 102 of an adjacent plane, e.g., 101 (FIG. 17b) of memory cells. The memory cell 104 (also FIG. 17b) can be connected to driving and sensing circuitry by the interconnect electrode lines 28 and 44 and access devices 304, such as gated transistors. When one of the driver 300 and sense circuit 302 is active on a given electrode line, the other is disabled.

The electrode line 28 has a sense circuit 302 and a driver circuit 300 that can be connected to the terminal ends of the line 28 by a via to a local interconnect and respective select gates 304. A select gate 304 scan be used to decouple the driver 300 from and couple the sensor 302 to the desired line 28 when the respective cell 104 is read. When the respective cell 104 is written the opposite takes place; another select gate 304 can decouple the line 28 from the sense circuit 302 and the line 28 is coupled to the driver 300. Of course, during this operation, another line 44 is also enabled by similar circuitry to address the respective cell. Alternatively, as a possible space-saving and/or fabrication simplifying arrangement, the driver circuit 300 and sensing circuit 302 can be connected to the electrode line 28 at the same terminal end.

The stacked memory cell and shared bit line/wordline array 100 architecture allows for a higher density memory array 100 with fewer masks needed during fabrication. Also, this configuration provides a lower cost in forming the array 100 and a simpler array layout. The periphery circuitry compensates for the simpler memory array layout to control the common wordlines and bit lines, i.e., the layers of electrode lines 28, 44, and 58, and utilizes select gates to float circuitry not being used.

Figure 19:
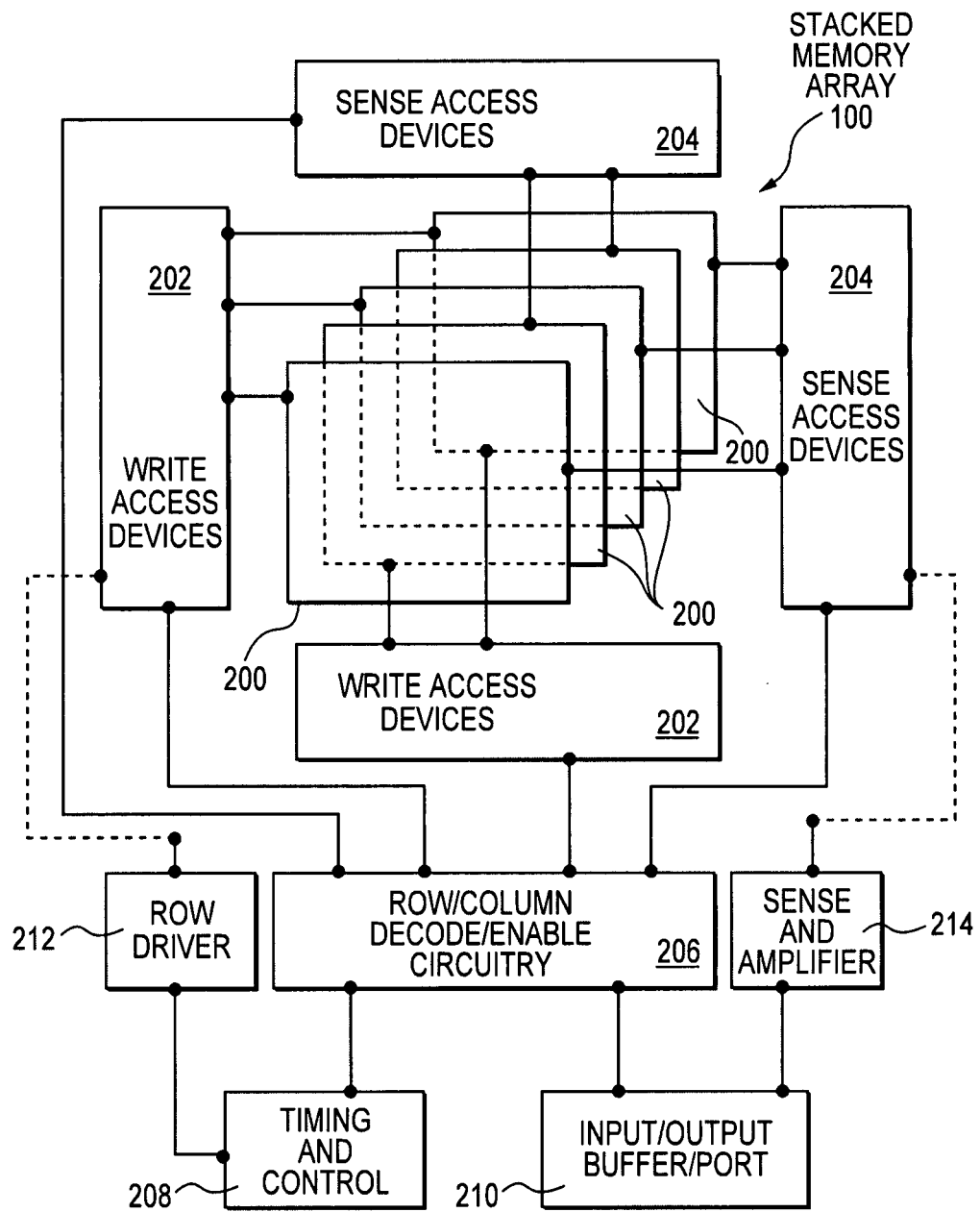
FIG. 19 shows a block diagram of circuit connections for a three dimensional memory array.

FIG. 19 shows how the memory array 100 can be connected with addressing, programming, and readout circuitry. Each level 200 of electrode lines 12, 28, 44, 58, 72 is in electrical connection with a write access device 202 and a sense access device 204, for example, an access transistor. The access devices 202, 204 electrically connect the electrode lines 12, 28, 44, 58, 72, and thereby, the memory cells 102, 104, 106, 108 (FIGS. 17b and 17d), which are between the representative electrode line levels 200, to row/column decode/enable circuitry 206. The row/column decode/enable circuitry 206 connects to timing and control circuitry 208 and row driver circuitry 212, and to input/output buffer/port circuitry 210 and sense and amplifier circuitry 214. As indicated above, the connections to the addressing, programming, and readout circuitry can be provided at both terminal ends of the lines, e.g., 28, or at a single end of the lines, e.g., 28.

According to an embodiment of the invention, the array 100 undergoes a biasing scheme in which unselected, surrounding bit lines and unselected wordlines the same level of an addressed memory cell are allowed to float, while simultaneously the selected, addressing bit line-wordline pair is subjected to a current pulse so as to cause the diode structure in the target memory cell to be pulsed in a forward bias direction. The direction of the forward bias current in the target memory cell, e.g., 104, is consistent with the voltage difference $V_{hi}$-$V_{lo}$, which will induce the required programming current in the phase change material of the cell, e.g., 104. This current pulse may be induced by a conventional voltage pulse having a magnitude of 2.5 volts. This biasing scheme combined with the diode structure of the memory cells provides reduced leakage current in the array. With reduced leakage current, the array 100 can be used in a wide range of applications, including as part of a dedicated memory device used in applications in which power consumption is a concern such as portable devices.

Figure 1B:
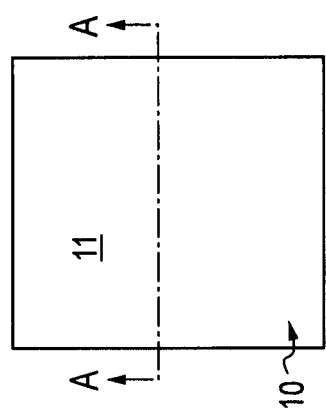
FIG. 1b shows a cross section of the array shown in FIG. 1a through line A-A.
Figure 1A:
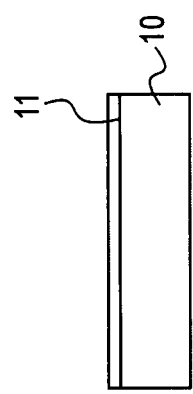
FIG. 1a shows a portion of a memory array during a stage of fabrication.

FIGS. 1a to 17e show stages of fabrication of a memory array 100 in accordance with an embodiment. FIGS. 1a and 1b show a substrate 10 upon which the array 100 can be fabricated. FIG. 1a shows the substrate from a top view and FIG. 1b shows the substrate 10 through cross section A-A. The substrate 10 can include logic circuits and all support circuitry (FIG. 19), formed on a semiconductor material under the area that will support the memory array 100 (FIG. 17b, for example). Preferably, the substrate is covered with an insulator layer 11, such as an oxide or silicon nitride layer, planarized to the tops of the support circuitry by chemical mechanical polishing if desired. These structures are not shown, but can be formed according to standard processing techniques known in the art.

Figure 2B:
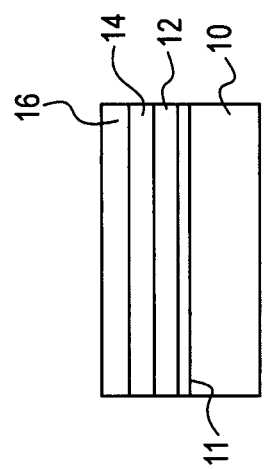
FIG. 2b shows a cross section of the array shown in FIG. 2a through line A-A.
Figure 2A:
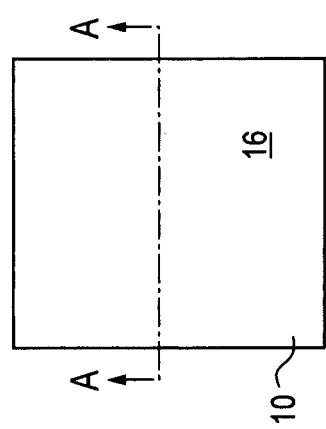

As shown in FIGS. 2a and 2b, a layer of metal 12 can be deposited over the substrate 10 and insulating material 11. The metal layer 12 can comprise conductive materials such as titanium (Ti), tungsten (W), tungsten nitride (WN), titanium nitride (TiN), titanium tungsten (TiW), carbon (C), Silicon carbide (SiC), titanium aluminum nitride (TiAlN), titanium silicon nitride (TiSiN), polycrystalline silicon, tantalum (Ta), tantalum nitride (TaN), platinum (Pt), silver (Ag), gold (Au), and combinations of such materials, for example a stack of TiN/WN/W with the TiN against the next-formed poly diode material 14, and can be deposited by known techniques, such as chemical vapor deposition, plasma enhanced chemical vapor deposition, evaporative techniques, and other methods. The metal layer 12 is preferably formed to be about 20 Å to about 2,000 Å thick. A diode layer 14 can be formed over the metal layer 12. The poly diode material layer 14 can be made of p-type poly-Si, which with later-formed silicide (e.g., $CoSi_2$ metal), forms Schottky barrier and backside (ohmic) contact structures and can be formed by known methods as well. A hard mask layer 16 is formed over the poly diode material layer 14. The hard mask 16 can be a nitride material and is preferably formed to be about 20 Å to about 4,000 Å thick. As shown in FIGS. 2a and 2b, the metal layer 12, poly diode material layer 14, and hard mask layer 16 are formed as a blanket across the substrate 10 and insulating layer 11.

Figure 4B:
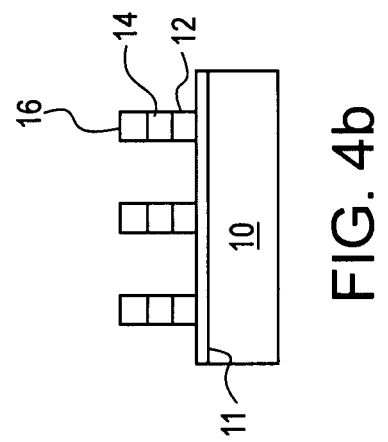
FIG. 4b shows a cross section of the array portion shown in FIG. 4a through line A-A.
Figure 4A:
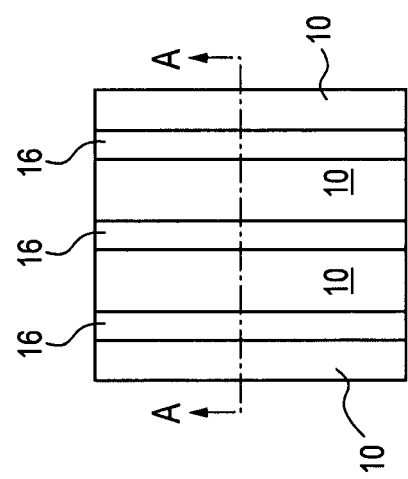

As shown in FIGS. 3a and 3b, the hard mask 16 is patterned with a photoresist mask 18. As shown in FIGS. 4a and 4b, the hard mask 16, poly diode material layer 14, and metal layer 12 are etched using mask 18 down to the substrate 10, or insulator 11 (which is shown in FIG. 4b), to leave stacked lines of these layers 12, 14, 16. As shown in FIGS. 5a and 5b, sidewall spacers 20 are formed on the sides of the stacked lines of metal layer 12, diode layer 14, and hard mask 16. These sidewall spacers 20 are formed by deposition, for example, of a nitride material or silicon oxide ($SiO_x$) and can be deposited by atomic layer deposition over the stacked lines 12, 14, and 16 and then etched to leave the sidewall spacers 20. A dielectric layer 22 is then formed over the substrate 10 and insulating layer 11, covering the sidewall spacers 20 and hard mask 16. The dielectric layer 22 is then planarized to expose the hard mask 16. The dielectric layer 22 can be made of many known insulative materials, but is preferably silicon oxide ($Si_yO_x$).

As shown in FIGS. 6a and 6b, the hard mask 16 is removed selective to the dielectric 22 and diode layer 14. The poly diode material layer 14 is then selectively coated with a silicide diode material 24, such as $CoSi_2$, which is treated to enhance electron injection into a phase change material to be formed thereover. This treatment can include forming one or more nanoparticles on the silicide diode material 24, forming a band engineered crested barrier over the material 24, or roughening the surface of the material 24 to increase its ability to produce high electric fields. Formation of the silicide material 24 over the poly diode material 14 creates a Schottky diode structure.

Figure 7B:
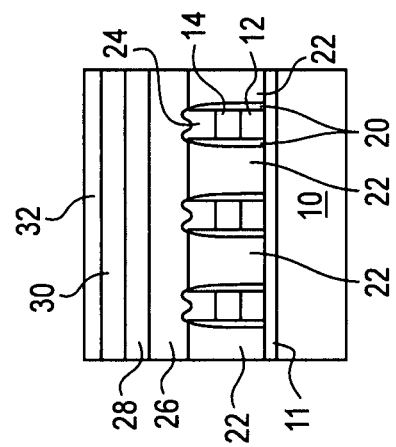
FIG. 7b shows a cross section of the array portion shown in FIG. 7a through line A-A.
Figure 7A:
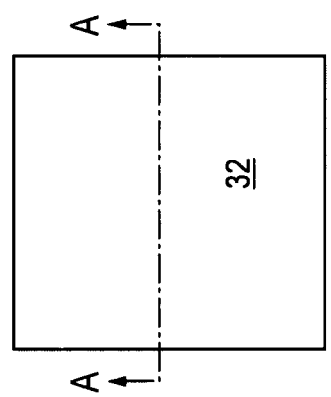

As shown in FIGS. 7a and 7b, phase change material, such as $Ge_2Sb_2Te_5$ (commonly referred to as GST), for example, is formed as a layer 26 over the silicide diode material 24 and dielectric layer 22. Other known phase change materials can be used for layer 26. The phase change material layer 26 can be deposited by sputtering, or other known techniques. An electrode layer 28 is formed over the phase change material layer 26 and can comprise metal or other conductive material. Preferably, the electrode layer 28 comprises the same material, e.g., TiN/WN/W, as metal layer 12 and is formed to similar dimensions. This electrode layer 28 completes the material layering for first plane 101 (FIG. 17b) of memory cells, including cell 102 (FIG. 17b), and also begins the material layering for next overlying plane 103 (FIG. 17b) of memory cells, including cell 104 (FIG. 17d), of the memory array 100.

Figure 8A:
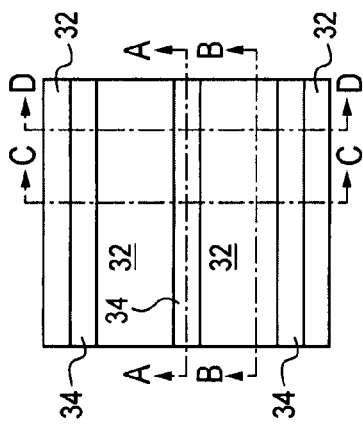
Figure 8B:
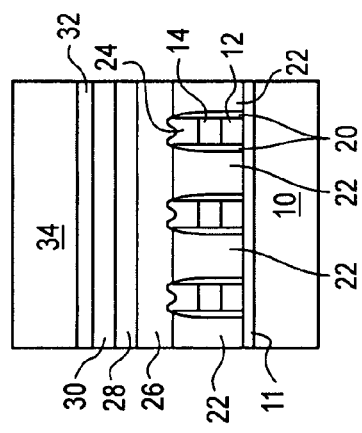
FIG. 8b shows a cross section of the array portion shown in FIG. 8a through line A-A.

Another poly diode material layer 30 can be formed over the electrode layer 28 and preferably comprises the same material, e.g., p-type poly, as diode layer 14. Another hard mask 32 is formed over the diode layer 30. This hard mask 32 can comprise the same material, e.g., nitride, as the first hard mask 16. As shown by FIGS. 8a and 8b, the hard mask 32 is patterned with a photoresist mask 34. The photolithographic pattern for the photoresist mask 34 can be specifically designated and original for this plane 101 (FIG. 17b) of cells, or the patterned mask used to form the photoresist mask 18 (FIG. 3b) can be rotated 90 degrees and reused.

Figure 8C:
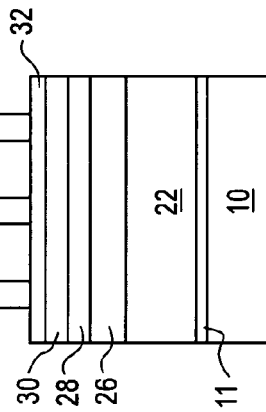
FIG. 8c shows a cross section of the array portion shown in FIG. 8a through like B-B.
Figure 8D:
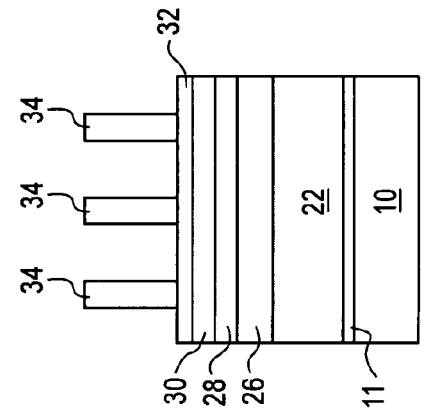
FIG. 8d shows a cross section of the array portion shown in FIG. 8a through line C-C.
Figure 8E:
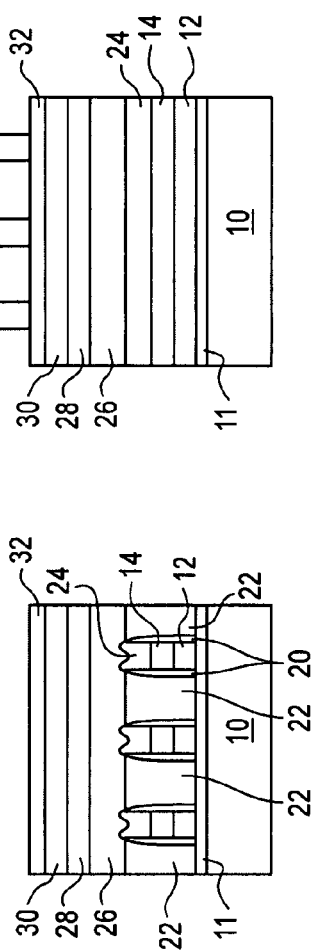
FIG. 8e shows a cross section of the array portion shown in FIG. 8a through line D-D.

FIG. 8b shows a cross section of the substrate 10 portion shown in FIG. 8a through line A-A, which runs through the photoresist mask 34. FIG. 8c shows a cross section of the substrate 10 portion of FIG. 8a through line B-B, which does not run through the photoresist mask 34. FIG. 8d shows a cross section of the substrate portion 10 of FIG. 8a through line C-C, which is orthogonal to the cross sections through lines A-A and B-B and through one of the stacked lines of layers 12, 14, and 24. FIG. 8e shows a cross section of the substrate 10 portion shown in FIG. 8a through line D-D, also orthogonal to lines A-A and B-B, which runs through the dielectric layer 22. The cross section lines A-A, B-B, C-C and D-D are respectfully maintained throughout the figures.

Figure 9E:
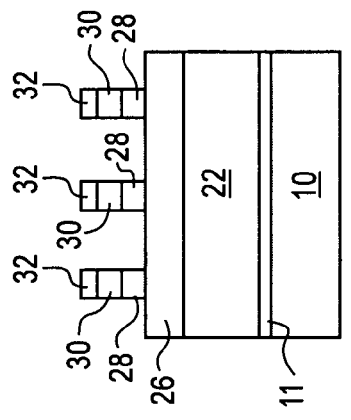
FIG. 9e shows a cross section of the array portion shown in FIG. 9a through line D-D.
Figure 9B:
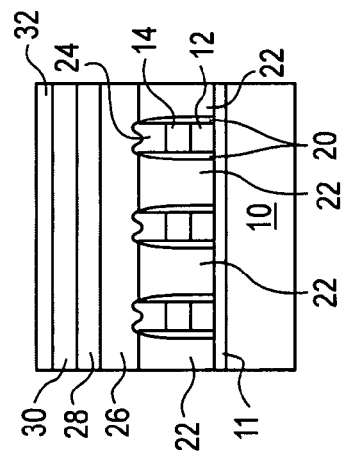
FIG. 9b shows a cross section of the array portion shown in FIG. 9a through line A-A.
Figure 9D:
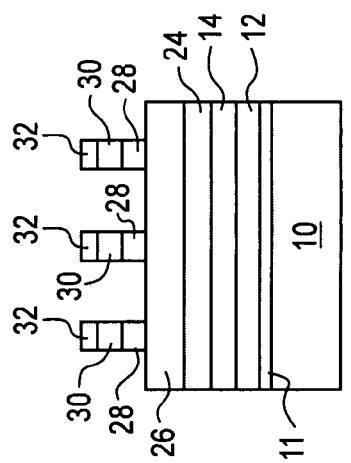
FIG. 9d shows a cross section of the array portion shown in FIG. 9a through line C-C.
Figure 9A:
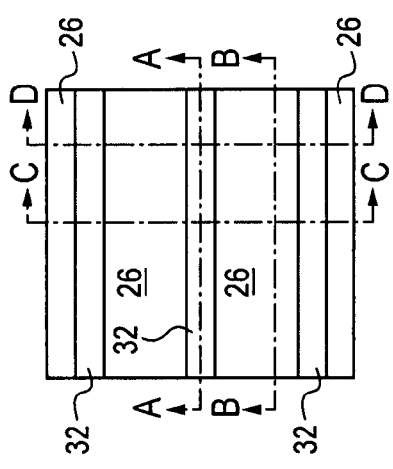
Figure 9C:
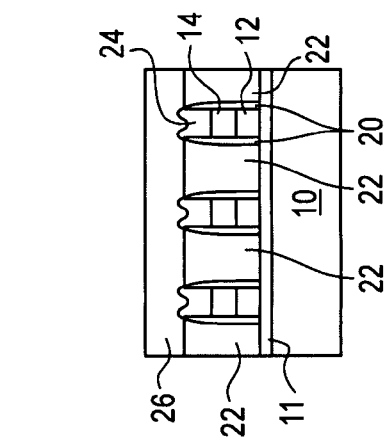
FIG. 9c shows a cross section of the array portion shown in FIG. 9a through like B-B.
Figure 12B:
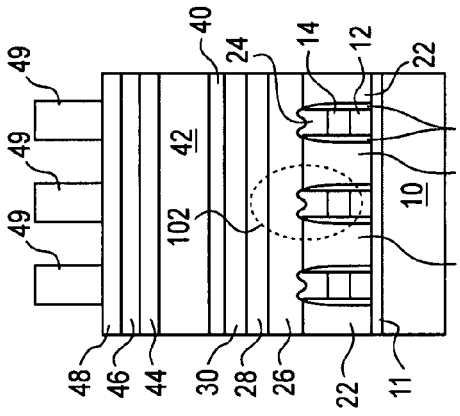
FIG. 12b shows a cross section of the array portion shown in FIG. 12a through line A-A.
Figure 12E:
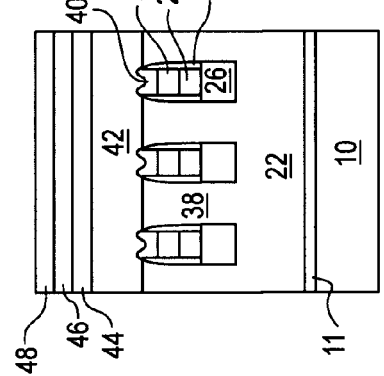
FIG. 12e shows a cross section of the array portion shown in FIG. 12a through line D-D.
Figure 12A:
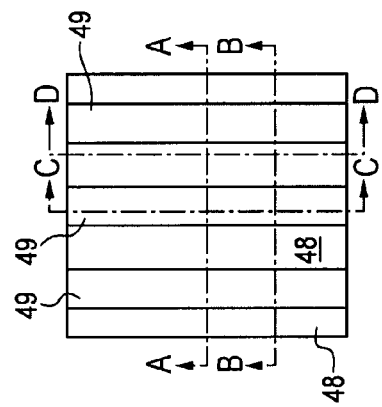
Figure 12D:
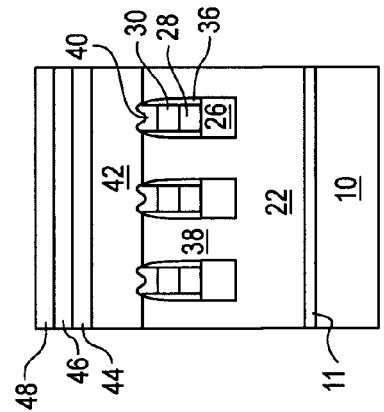
FIG. 12d shows a cross section of the array portion shown in FIG. 12a through line C-C.
Figure 12C:
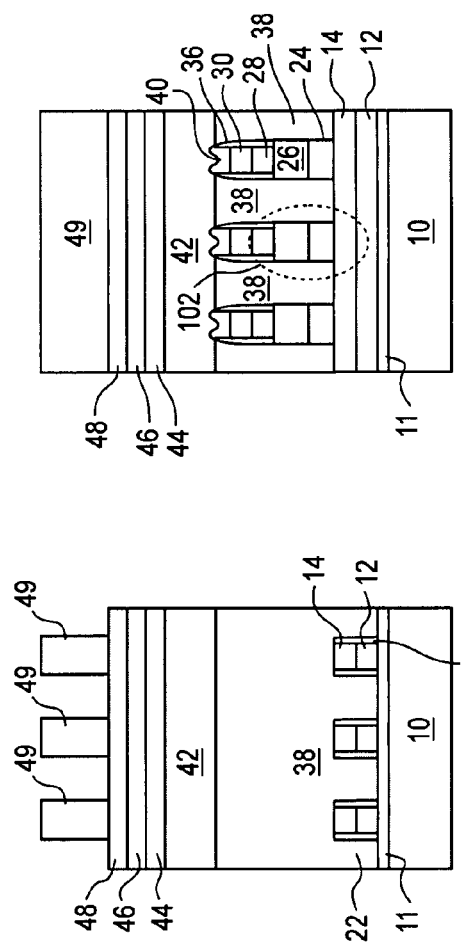
FIG. 12c shows a cross section of the array portion shown in FIG. 12a through like B-B.

As shown in FIGS. 9a, 9d, and 9e, using the respective single, patterned, photoresist mask 34, the hard mask 32, poly diode material layer 30, and electrode layer 28 are etched to the phase change material layer 26 to leave stacked lines of these layers 28, 30, 32, which can be orthogonal to the underlying lines of layers 12, 14 and 24. As shown in FIG. 9b, layers 28, 30, and 32 are present through line A-A, but as shown in FIG. 9c, they are not present through line B-B.

FIGS. 10a, 10d, and 10e show that sidewall spacers 36 are formed on the sides of the stacked layers 28, 30, and 32. As explained above with regard to sidewall spacers 20, sidewall spacers 36 can be formed by depositing an insulating layer, e.g., silicon oxide or nitride material, over the stacked layers 28, 30, and 32 and etching. Next, as shown in FIGS. 11a, 11b, 11c, 11d, and 11e, the sidewall spacer 36 etch is continued through the phase change material layer 26 and silicide layer 24 to stop at the poly diode material 14 and singulate the silicide diode material layer 24 to prevent cross talk among memory cells, e.g., 102 (FIG. 17b). Alternatively, this etch may be carried through the poly diode material 14 and stop on layer 12, which singulates the entire diode structure. This etching of the sidewall spacers 36 does not require another mask and completes the definition of the memory cell 102. A dielectric 38 is deposited to fill the trenches formed by the sidewall spacer 36 etch. The dielectric 38 can be planarized to the hard mask 32. Next, the hard mask 32 is removed selective to the dielectric 38 and poly diode material layer 30. The poly diode material layer 30 is then selectively coated with a silicide material 40, which is treated, e.g., by roughening, forming nanoparticles or crested barrier, etc., to enhance electron injection into a phase change material to be formed thereover. This silicide material layer 30, with the poly diode material 30, forms a Schottky diode.

As shown in FIGS. 12a, 12b, 12c, 12d, and 12e, a phase change material, such as GST, for example, is formed as a layer 42 over the silicide 40 and dielectric layer 38. Other phase change materials can also be used. The phase change material layer 42 can be deposited by sputtering, or other known techniques. An electrode layer 44 is formed over the phase change material layer 42 and can comprise metal or other conductive material. Preferably, the electrode layer 44 comprises the same material as metal layer 12 and electrode layer 28, e.g., a TiN/WN/W stack, and is formed to similar dimensions. This electrode layer 44 completes the material layering for a second plane 103 (FIG. 17b) of memory cells, including cell 104 (FIG. 14b), and begins as the first material layer for the overlying plane 105 (FIG. 17b) of memory cells, including cell 106 (FIG. 17b), of the memory array 100.

Another poly diode material layer 46 can be formed, for example, of p-type poly, over the electrode layer 44 and preferably comprises the same material as diode layers 14 and 30. Another hard mask 48 is formed over the poly diode layer 46. This hard mask 48 can comprise the same material, e.g., nitride, as the first hard mask 16 and second hard mask 32. A patterned photoresist mask 49 is formed over the hard mask 48. No more than this single mask is needed in forming the respective plane 103 (FIG. 17b) of memory cells, e.g., 104 (FIG. 14b). As with the patterned mask 34, the pattern used to form mask 18 can be reused to form mask 49 if rotated back 90 degrees from the alignment use to form mask 34 or an original designated pattern can be used. Whether an original and plan-specific or reused and rotated mask is used, no more than a single mask per central memory cell plane, e.g., plane 103 including memory cell 104, is required.

FIGS. 13a, 13b, and 13c show that, as discussed above in relation to the processing steps shown in FIGS. 9a, 9d, and 9e, the hard mask 48 is etched to the phase change layer 42 to leave stacks of layers 44, 46, and 48. FIGS. 14a, 14b, and 14c show that sidewall spacers 54 are formed on the sides of the stacked layers 44, 46, and 48 (hard mask 48 is shown in FIG. 13b, for example). As explained above with regard to sidewall spacers 20 and 36, sidewall spacers 54 can be formed by depositing an insulating layer over the stacked layers 44, 46, and 48 and etching. The sidewall spacer 54 etch is continued through the phase change material layer 42 and silicide diode material layer 40 to singulate the silicide diode material layer 40 to prevent cross talk among memory cells, e.g., 104 (FIG. 17d). This etch step defines the stacked memory cell 104. Alternatively, this etch may be carried through the poly diode material 30 and stop on layer 28, which singulates the entire diode structure.

Next, as also shown in FIGS. 14b, 14c and 14e, a dielectric 50 is deposited to fill the trenches formed by the sidewall spacer 54 etch. The dielectric 50 can be planarized to the hard mask 48 (e.g., FIG. 13b). Next, the hard mask 48 is removed selective to the dielectric 46 and poly diode material layer 50. The poly diode layer 46 is then selectively coated with a silicide diode material 52, such as CoSi$_2$, which is treated, e.g., by roughening or adding nanoparticle(s) or forming a crested barrier, for enhancing electron injection into a phase change material to be formed thereover. The silicide diode material 52 forms a Schottky diode with the poly diode material 50.

As shown in FIGS. 15a, 15b, 15c, 15d, and 15e, a phase change material, such as GST, for example, is formed as a layer 56 over the silicide diode material 52 and dielectric layer 50. However, other phase change materials can be used also. The phase change material layer 56 can be deposited by sputtering, or other known techniques. An electrode layer 58 is formed over the phase change material layer 56 and can comprise metal or other conductive material. Preferably, the electrode layer 58 comprises the same material, e.g., TiN/WN/W, as metal layer 12, electrode layer 28, and electrode layer 44 and is formed to similar dimensions. This electrode layer 58 completes the material layers for a third plane 105 (FIG. 17b) of memory cells, including cell 106 (FIG. 17d), and begins as the first material layer for the overlying plane 107 (FIG. 17b) of memory cells, including cell 108 (FIG. 17b), of the memory array 100. Another poly diode layer 60 can be formed over the electrode layer 58 and preferably comprises the same material, e.g., p-type poly, as diode layers 14, 30, and 46. Another hard mask 62 is formed over the poly diode layer 60. This hard mask 62 can comprise the same material, e.g., nitride, as the hard masks 16, 32, and 48.

Figure 16E:
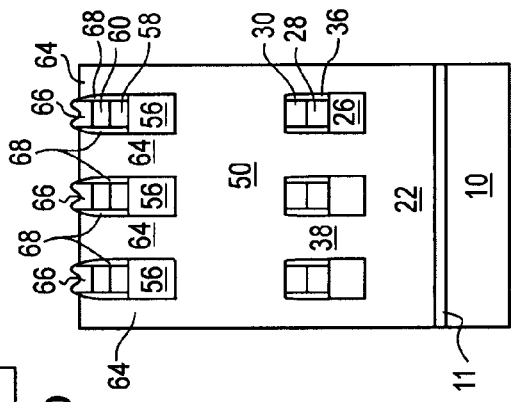
FIG. 16e shows a cross section of the array portion shown in FIG. 16a through line D-D.
Figure 16B:
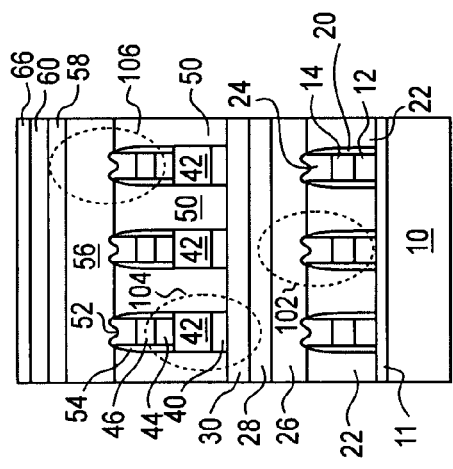
FIG. 16b shows a cross section of the array portion shown in FIG. 16a through line A-A.
Figure 16D:
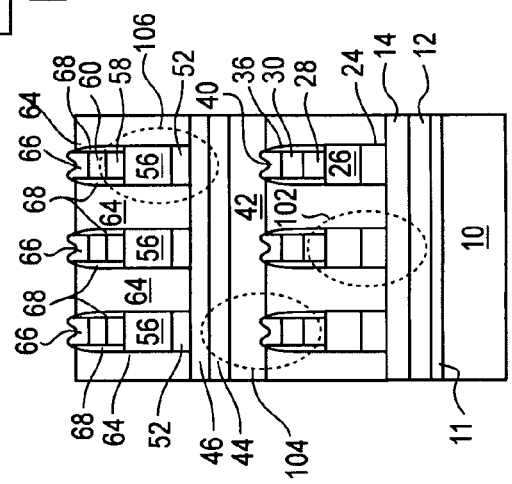
FIG. 16d shows a cross section of the array portion shown in FIG. 16a through line C-C.
Figure 16A:
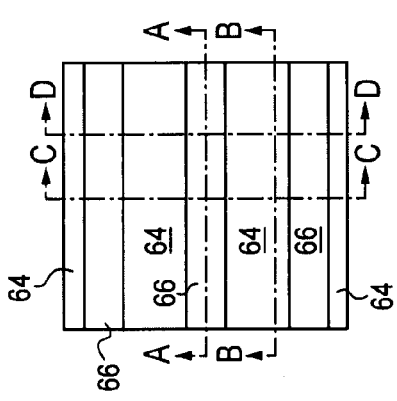
Figure 16C:
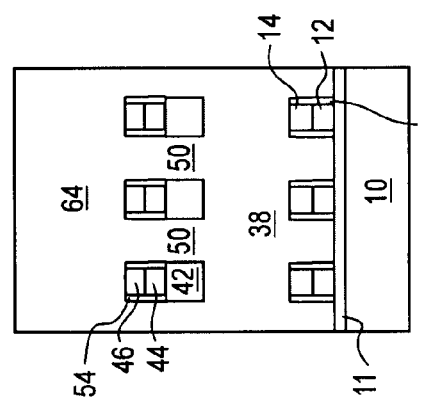
FIG. 16c shows a cross section of the array portion shown in FIG. 16a through like B-B.

FIGS. 16a, 16d, and 16e show that, as discussed above in relation to the processing steps shown in FIGS. 9a and 13a, the hard mask 62 is patterned with photoresist (not shown) and etched to the phase change layer 56 to leave stacks of layers 58, 60, and 62. Again, this is the only patterned mask needed in forming this plane 105 (FIG. 17b) of memory cells and can be an original pattern or the pattern used to form mask 34 can be reused. Whether an original or reused mask is used, no more than a single mask per central memory cell plane, such as plane 105 including memory cell 106, is required.

FIGS. 16d and 16e show that sidewall spacers 68 are formed on the sides of the stacked layers 58, 60, and 62 (hard mask 62 is shown in FIG. 15d, for example). As explained above with regard to sidewall spacers 20, 36, and 54, sidewall spacers 68 can be formed by depositing an insulating layer, e.g., silicon oxide or nitride, over the stacked layers 58, 60, and 62 and etching. The sidewall spacer 68 etch is continued through the phase change material layer 56 and silicide diode layer 52 to stop at the poly diode layer 50 and singulate the silicide diodes layer 52 to prevent cross talk among memory cells, e.g., 106 (FIG. 17b). Alternatively, this etch may be carried through the poly diode material 46 and stop on layer 44, which singulates the entire diode structure. Next, as also shown in FIGS. 16a, 16c, 16d, and 16e, a dielectric 64 is deposited to fill the trenches formed by the sidewall spacer 68 etch. The dielectric 64 can be planarized to the hard mask 62. Next, the hard mask 62 is removed selective to the dielectric 64 and poly diode layer 60. The poly diode layer 60 is then selectively coated with a silicide diode material 66, which is treated for high electron injection for phase change material to be formed thereover; this forms a Schottky diode.

As shown in FIGS. 17a, 17b, 17c, 17d, and 17e, a phase change material, such as GST, for example, is formed as a layer 70 over the silicide diode material 66 and dielectric layer 64. Again, other phase change materials can be used. The phase change material layer 70 can be deposited by sputtering, or other known techniques. An electrode layer 72 is formed over the phase change material layer 70 and can comprise metal or other conductive material. Preferably, the electrode layer 70 comprises the same material, e.g., TiN/WN/W, as metal layer 12 and electrode layers 28, 44, and 58 and is formed to similar dimensions. This electrode layer 58 completes the material layers for a fourth plane 107 of memory cells, including cell 108, of the memory array 100.

Another hard mask 74 is formed over the electrode layer 72. Note, since this is the top electrode 72 stack in this embodiment, no diode need be included; however, this need not necessarily be the top electrode and additional planes of memory cells could be included in the array 100 if desired. The hard mask 74 can comprise the same material, e.g., nitride, as the hard masks 16, 32, 48, and 62 and is preferably formed to the same dimensions. FIGS. 17a, 17b, and 17c show that, as discussed above in relation to the processing steps shown in FIGS. 9a, 13a, and 16a, the hard mask 74 can be patterned with photoresist (not shown) and etched through the phase change layer 70 and silicide diode layer 66 to leave stacks of layers 66, 70, 72, and 74. Alternatively, this etch may be carried through the poly diode material 60 and stop on layer 58, which singulates the entire diode structure. Note, no sidewall spacers are necessarily included in this top-most stack. Next, as also shown in FIGS. 17a, 17b, 17c, and 17e, a dielectric 76 is deposited to fill the trenches formed defining the stacks of layers 68, 70, 72, and 74. The dielectric 76 can be planarized to the hard mask 74.

The method and structures described in relation to FIGS. 1a through 17e, 19 and 20 provide a simpler and less expensive fabrication for a three-dimensional memory array. Because no more than a single patterned mask is required to fabricate memory cell planes 103 and 105, which are the central planes of the embodiment shown, many processing steps required of prior techniques, including the use of multiple, often many, patterned masks per layer of memory cells, can be omitted from the fabrication. Further, the use of shared interconnect lines, e.g., 44, further simplifies the array structure and also conserves valuable array landscape for other features, making for a denser memory device.

The above-described processing techniques for fabricating a memory device allow the use of a 248 nm (photolithographic) scanner, which may initially create 200 nm pitch line/space pairs with 34 nm alignment control. The array features can then be pitch multiplied to create masks of 50 nm pitch line/space pairs (nominally 25 nm each) on each array 100 level. Because there is no tight alignment requirement in fabricating the array, one does not need the typical f/3 of 8 nm alignment budget that would require a state of the art photo tool (which could cost between about $40-45 million) and may instead use a 248 nm photo tool (which typically cost between about $15-20 million) to create high density memory products. Thus manufacturing costs can be significantly reduced by use of the above described processes, which allow for loosening the alignment requirement of the memory array.

Figure 18:
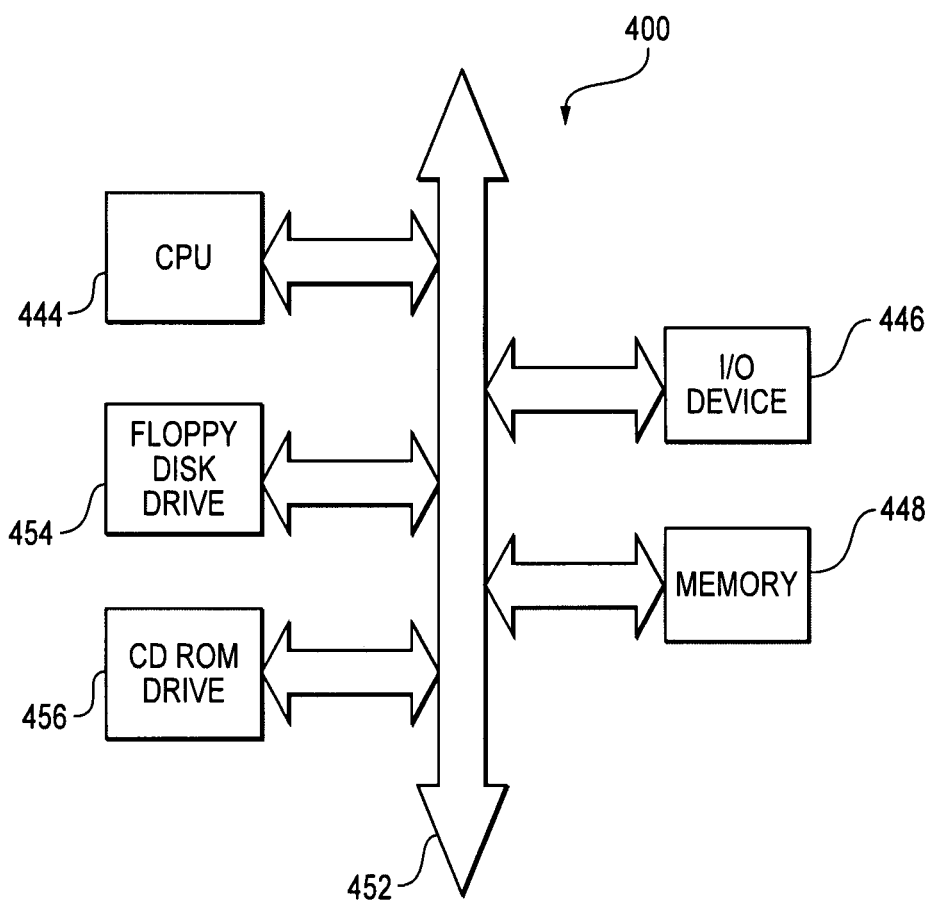

FIG. 18 illustrates a simplified processor system 400, such as a computer, including a memory circuit 448 employing an array of phase change memory devices as shown in FIGS. 17a-17e fabricated in accordance with the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory circuit 448 communicates with the CPU 444 over bus 452, typically through a memory controller.

In the case of a computer system, the processor system may include peripheral devices, such as a floppy disk drive 454 and a compact disc (CD) ROM drive 456, which also communicate with CPU 444 over the bus 452. Memory circuit 448 is preferably constructed as an integrated circuit. If desired, the memory circuit 448 may be combined with the processor, for example CPU 444, in a single integrated circuit.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A method of forming a three-dimensional memory array, comprising:
    forming a first plane of variable resistance memory cells, a second plane of variable resistance memory cells, and at least one central plane of variable resistance memory cells between said first and second planes; and
    using no more than one patterned mask and a sidewall etching step per each central plane to define the respective variable resistance memory cells.

2. The method of claim 1, further comprising forming variable resistance memory cells of adjacent planes such that they share memory cell interconnect lines.

3. The method of claim 1, further comprising forming the variable resistance memory cells of the planes to each comprise a variable resistance material in electrical communication with an associated diode.

4. The method of claim 1, wherein the variable resistance memory cells are phase change memory cells.

5. The method of claim 4, wherein said phase change memory cells comprise $Ge_2Sb_2Te_5$.

6. The method of claim 1, comprising forming at least two central planes of variable resistance memory cells.

7. The method of claim 6, further comprising forming the memory cells of both of the at least two central planes using a single mask.

8. The method of claim 7, wherein said single mask is rotated with respect to the array between forming the memory cells of a first central plane and forming the memory cells of a second central plane.

9. The method of claim 1, wherein forming the memory cells of the at least one central plane comprises:
    forming a first electrode line;
    forming a diode over the first electrode line;
    forming a phase change material over the diode; and
    forming a second electrode line over the phase change material.

10. The method of claim 9, wherein said first and second electrode lines are orthogonal to one another.

11. The method of claim 9, wherein the first and second electrode lines comprise stacks of TiN/WN/W.

12. The method of claim 9, wherein the diode comprises p-type poly and $CoSi_2$.

13. The method of claim 12, further comprising treating the $CoSi_2$ to enhance electron injection into the phase change material.

14. The method of claim 9, further comprising forming insulating sidewalls on the first electrode line and diode.

15. The method of claim 9, further comprising forming at least a second central plane of variable resistance memory cells, comprising:
    forming a second diode over the second electrode line;
    forming insulating sidewalls on the second electrode line and second diode;
    forming a second phase change material over the second diode; and
    forming a third electrode line over the second phase change material.

16. The method of claim 1, wherein the respective memory cells in said planes are arranged in a cross point architecture.

17. A method of forming a memory device, comprising:
    forming a first electrode line over a substrate;
    forming a first diode over the first electrode line;
    forming a first phase change material over the first diode;
    forming a second electrode material over the first phase change material;

forming a second diode over the second electrode material;
forming a first patterned mask over the second diode;
using the first patterned mask, etching the second diode, and the second electrode, stopping at the first phase change material, so as to form a second electrode line of the second electrode material in a crossing arrangement with the first electrode line;
forming a first dielectric material over the second diode, the second electrode line, and the first phase change material; and
etching the first dielectric material to leave sidewall spacers on the second diode and second electrode material and continuing the etch through the first phase change material.

18. The method of claim 17, further comprising:
forming a second phase change material over the second diode;
forming a third electrode material over the second phase change material;
forming a third diode over the third electrode material;
forming a second patterned mask over the third diode;
using the second patterned mask, etching the third diode, and the third electrode material, stopping at the second phase change material, so as to form a third electrode line of the third electrode material in a crossing arrangement with the second electrode line;
forming a second dielectric material over the third diode, the third electrode line, and the second phase change material; and
etching the second dielectric material to leave sidewall spacers on the third diode and third electrode line and continuing the etch through the second phase change material.

19. The method of claim 18, further comprising:
forming a first silicide material as part of the first diode;
forming a second silicide material as part of the second diode; and
forming a third silicide material as part of the third diode.

20. The method of claim 19, further comprising:
forming a third phase change material over the third silicide material;
forming a fourth electrode material over the third phase change material;
forming a fourth diode over the fourth electrode material;
forming a third patterned mask over the fourth diode;
using the third patterned mask, etching the fourth diode, and the fourth electrode material, stopping at the third phase change material, so as to form a fourth electrode line from the fourth electrode material in a crossing arrangement with the third electrode line;
forming a third dielectric material over the fourth diode, the fourth electrode line, and the third phase change material;
etching the third dielectric material to leave sidewall spacers on the fourth diode and fourth electrode line and continuing the etch through the third phase change material;
forming a fourth silicide as part of the fourth diode;
forming a fourth phase change material over the fourth silicide;
forming a fifth electrode material over the fourth phase change material;
forming a hard mask material over the fifth electrode material;
forming a fourth patterned mask over the hard mask material;
using the fourth patterned mask, etching the hard mask material, the fifth electrode material, the fourth phase change material, and the fourth silicide, stopping at the fourth diode so as to form a fifth electrode line from the fifth electrode material in a crossing arrangement with the fourth electrode line;
forming a fourth dielectric material over the hard mask material, the fifth electrode line, the fourth phase change material, the fourth silicide, and the fourth electrode line.

21. The method of claim 17, wherein said phase change material comprises $Ge_2Sb_2Te_5$.

22. The method of claim 17, wherein after forming the first electrode line, the first patterned mask is the only mask used to define a first plane of memory cells.

23. The method of claim 18, wherein after forming the first electrode line, the first patterned mask and the second patterned mask are the only masks used to define a first plane of memory cells and a second plane of memory cells, respectively.

24. The method of claim 20, wherein after forming the first electrode line, the first patterned mask, the second patterned mask, the third patterned mask, and the fourth patterned mask are the only masks used to define a first plane of memory cells, a second plane of memory cells, a third plane of memory cells, and a fourth plane of memory cells, respectively.

* * * * *